US008652384B2

(12) United States Patent
Chen et al.

(10) Patent No.: US 8,652,384 B2
(45) Date of Patent: Feb. 18, 2014

(54) METHOD FOR MOLDING SEMICONDUCTOR DEVICE

(75) Inventors: Quan Chen, Tianjin (CN); Wei Gai, Tianjin (CN); Yanbo Xu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/489,466

(22) Filed: Jun. 6, 2012

(65) Prior Publication Data

US 2013/0005087 A1    Jan. 3, 2013

(30) Foreign Application Priority Data

Jun. 30, 2011    (CN) .......................... 2011 1 0180310

(51) Int. Cl.
*B29C 45/14* (2006.01)

(52) U.S. Cl.
USPC ............ 264/272.14; 264/272.15; 264/272.17; 264/275; 264/160

(58) Field of Classification Search
None
See application file for complete search history.

(56) References Cited

U.S. PATENT DOCUMENTS

| | | | |
|---|---|---|---|
| 6,309,914 B1 * | 10/2001 | Huang et al. .................. 438/124 |
| 6,747,345 B1 | 6/2004 | Bolken | |
| 7,169,345 B2 * | 1/2007 | Murugan ................ 264/272.15 |
| 7,241,414 B2 | 7/2007 | Ho | |
| 8,105,063 B1 | 1/2012 | Lee | |
| 2007/0080466 A1 | 4/2007 | Chou | |

* cited by examiner

*Primary Examiner* — Edmund H. Lee
(74) *Attorney, Agent, or Firm* — Charles Bergere

(57) ABSTRACT

An apparatus for molding a semiconductor device includes an upper mold chase and a lower mold chase. The mold chases are capable of being aligned with each other, forming spaced cavities for receiving a lead frame array that includes semiconductor dies for encapsulation. The cavities are aligned in spaced, vertical columns and gates are provided at the opening of each column of cavities. A molding compound is passed through the gates and flows uninterrupted through each cavity and encapsulates the semiconductor dies.

6 Claims, 6 Drawing Sheets

METHOD FOR MOLDING SEMICONDUCTOR DEVICE

BACKGROUND OF THE INVENTION

The present invention relates to semiconductor packaging, and, more particularly, to a molding apparatus for molding semiconductor devices.

Semiconductor packaging is the final stage in semiconductor device fabrication, where an integrated circuit (IC) is encapsulated with a material such as plastic or resin. In many types of packages, a lead frame is used for providing electrical interconnections to a semiconductor die. The semiconductor die is attached to the lead frame and bonding pads of the semiconductor die are electrically connected to leads of the lead frame, typically with wires, by a wire-bonding process. The leads allow for electrical interconnections between the semiconductor die and external circuitry.

A lead frame assembly (lead frame with attached die and bond wires) is placed in a cavity defined by mold chases (top and bottom mold chases), and the molding compound is poured or injected into the cavity. The final packaged semiconductor device is formed by separating the mold chases and performing appropriate processes on the molded lead frame such as trimming and forming of leads.

FIG. 1 is a schematic diagram illustrating a step in a conventional semiconductor assembly or packaging process. FIG. 1 shows a lead frame structure or array 100 that includes a plurality of individual lead frames 102. In this case, the lead frames 102 are used to form dual-in-line packages (DIP). Each individual lead frame 102 includes a die pad on which a semiconductor die 104 is attached and an opposing pair of rows of leads 106. The semiconductor dies 104 are electrically connected to the leads 106 of a respective lead frame 102 with bond wires 108. The leads 106 may extend beyond the mold compound or encapsulation material (not shown) in order to serve as the means for external electrical connections between the semiconductor die 104 and external circuitry. The lead frame array 100 with attached dies 104 is placed in a mold chase so that an encapsulation process may be performed.

FIG. 2 is a schematic view of a bottom mold chase 202 of a conventional molding apparatus 200, a top mold chase being a mirror image of the bottom chase 202. The top and bottom mold chases are configured to align with each other. The bottom mold chase 202 and the top mold chase include one or more cavities 204 for receiving the lead frame assembly (lead frame array 100 and dies 104) of FIG. 1, where the individual lead frames 102 are received within respective ones of the cavities 204 of the bottom mold chase 202. The bottom mold chase 202 includes a runner 206 and gates 208 at each of the cavities 204.

A mold compound is introduced into the cavities 204 via the runner 206 and gates 208. When the mold compound hardens, the top and bottom mold chases are separated and the encapsulated lead frame assembly is removed. Individual semiconductor devices are then formed by separating the molded semiconductor dies from each other.

One of the disadvantages with the conventional molding apparatus 200 is that the individual cavities 204 are spaced from each other so that the actual design of the mold chase is inefficient. The space occupied by the runner 206 and gates 208 also results in a low density lead frame array or strip design. As seen in FIG. 1, the lead frame array 100 has two vertical columns of lead frames 102 in which the lead frames 102 are spaced from adjacent lead frames in both the X and Y directions. Further, the mold compound only flows to the individual cavities 204 but does not flow between cavities 204, i.e., from one cavity into an adjacent cavity. Also, the mold compound flows down the single runner 206 in one direction and must change direction 90° to flow into the cavities 204. The mold chase 202 also has a gate 208 for each cavity 204 and high pressure is needed to insure the mold flows into each of the cavities 204.

It would be advantageous to provide a molding apparatus that accommodates more lead frames and allows for uniform mold flow but with lower pressure.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
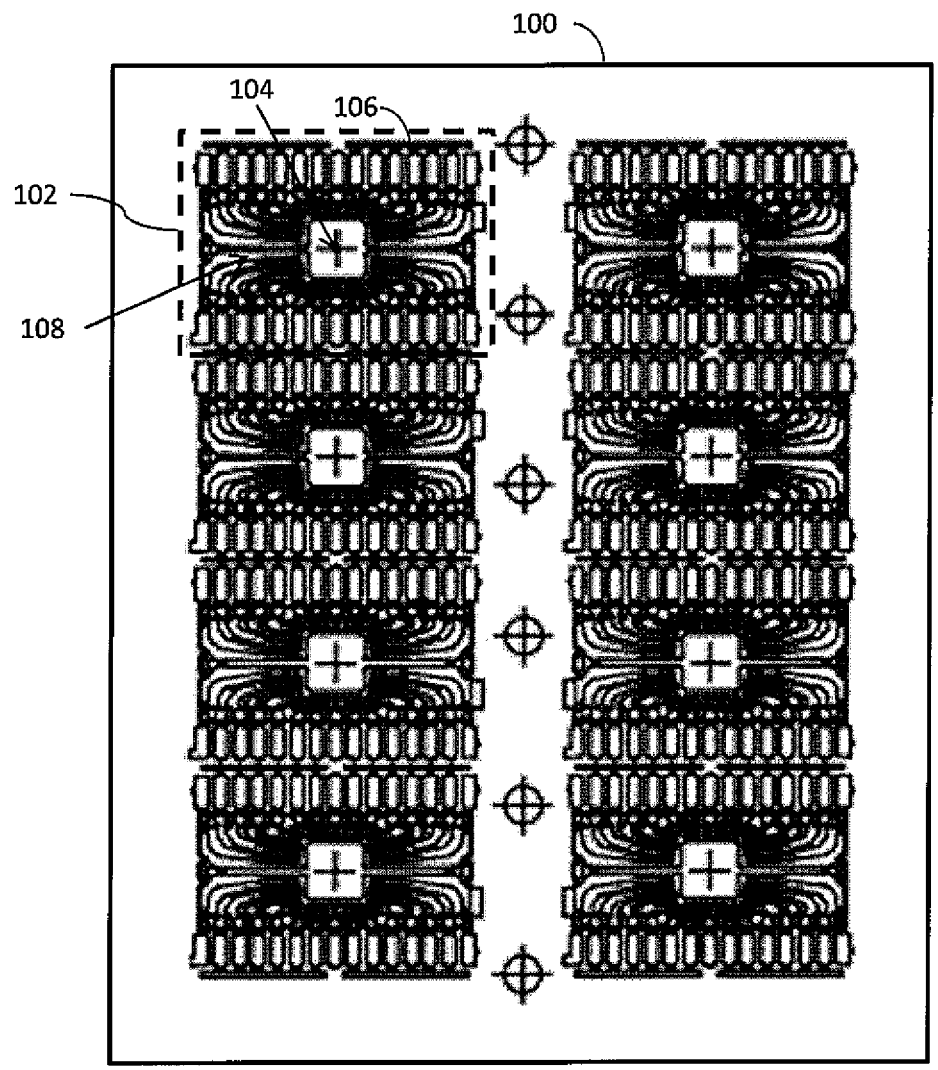
FIG. 1 is a schematic diagram of a conventional lead frame assembly.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an apparatus for encapsulating a lead frame array with a molding compound is provided. The apparatus includes an upper mold chase and a lower mold chase capable of being aligned with each other. The upper and lower mold chases each include a plurality of columns of cavities. Each column of cavities receives a plurality of lead frames of the lead frame array such that each lead frame in a column forms a row across the plurality of columns. The apparatus further includes at least one pot for storing the molding compound. A plurality of passageways connect the plurality of columns of cavities to the at least one pot. Each passageway connects the respective one of the columns to the at least one pot. The mold compound flows from the pot to each of the columns by way of the plurality of passageways and over each lead frame in a column.

In another embodiment of the present invention, a lead frame array is provided. The lead frame array includes a plurality of lead frames forming a plurality of columns. Each column includes one or more lead frames, wherein each of the lead frames in a column form rows across the columns. Each lead frame includes a pair of leads on opposing sides of the lead frame for forming dual-in-line (DIP) packaged devices.

The lead frames within a column are aligned with each other such that the leads of each lead frame in a column extend outwardly from the column.

In yet another embodiment of the present invention, a method for encapsulating a semiconductor device with a molding compound is provided. A molding apparatus that includes an upper mold chase and a lower mold chase is provided. The upper and lower mold chases each include a plurality of columns of cavities. Each column of cavities receives a plurality of lead frames of a lead frame array such that each of the lead frames in a column forms rows across the plurality of columns. The lead frame array including the plurality of lead frames is placed into the plurality of cavities. Each lead frame includes at least one row of leads that is aligned along the length of the cavity and a die pad having a semiconductor die attached to the lead frame. The molding compound is injected into the at least one cavity to encapsulate the plurality of semiconductor dies. The molding compound flows uninterrupted along the cavity, over each lead frame of a column and encapsulates each semiconductor die. Trim, forming and singulation operations are performed for separating the plurality of encapsulated semiconductor dies.

Various embodiments of the present invention provide a molding apparatus and process for molding a semiconductor die. The molding apparatus includes top and bottom mold chases that may be aligned to define a plurality of cavities and each cavity is capable of receiving a plurality of semiconductor dies of different sizes. Thus, the mold chase design allows production flexibility and molding of different package products using the same mold chase design. The mold chase design reduces the conversion time from design phase to production phase and provides high package density for the same lead frame size, and subsequently reduces the packaging costs. After molding, saw singulation and trim and form processes may be performed to separate the array into individual packaged devices.

Figure 3:
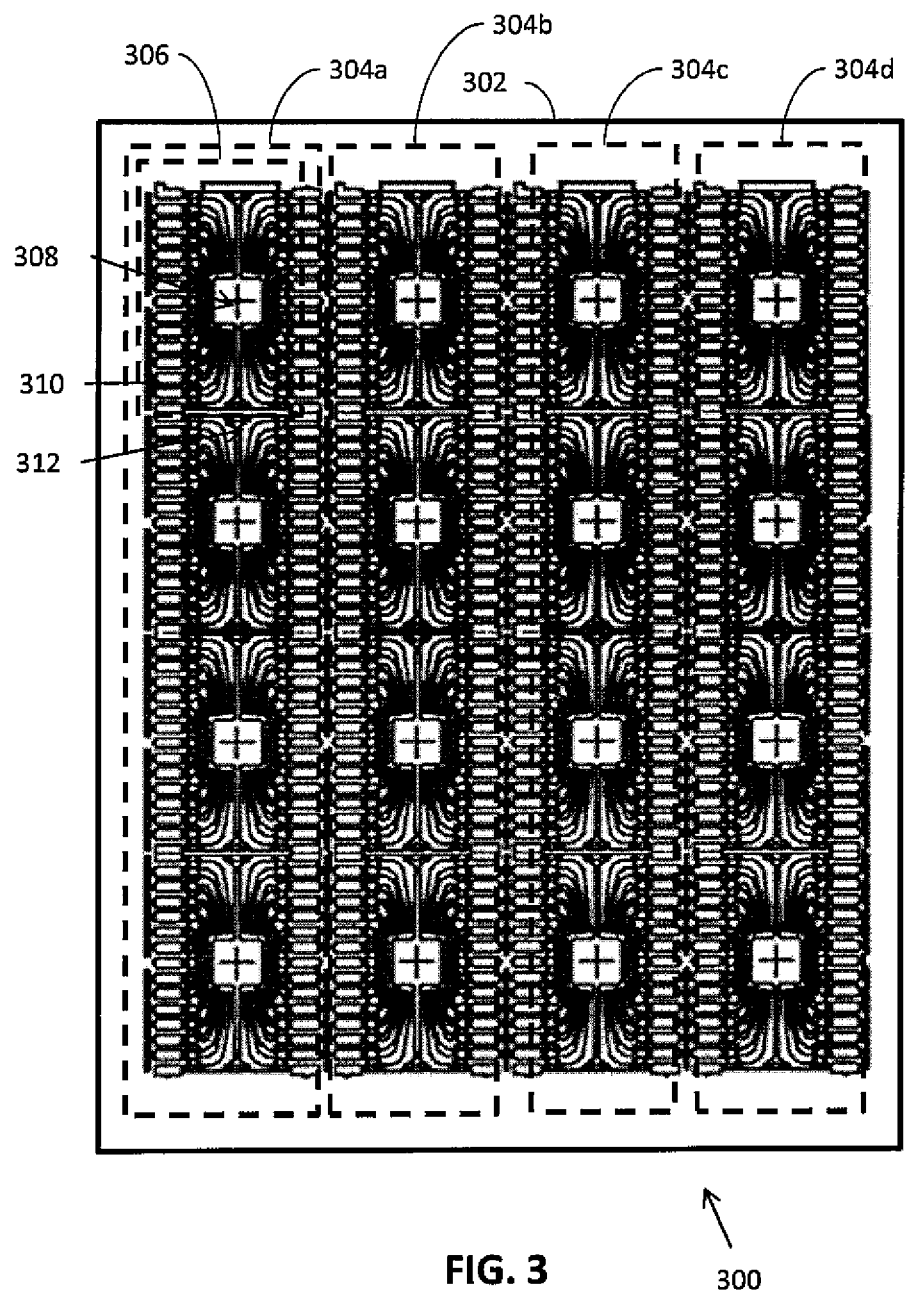
FIG. 3 is a schematic diagram of a lead frame assembly in accordance with an embodiment of the present invention.

Referring now to FIG. 3, a schematic diagram of a lead frame assembly 300 in accordance with an embodiment of the present invention is shown. The lead frame assembly 300 includes a lead frame array 302 has a plurality of columns of lead frames 304a-304d (collectively referred to as lead frame columns 304). Each lead frame column 304 includes a plurality of lead frames 306. In FIG. 3, each lead frame 306 has a semiconductor die 308 attached and electrically connected thereto. The semiconductor dies 308 may be a processor, such as a digital signal processor (DSP), a special function circuit, or a circuit that performs any other type of function.

Lead frames 306 in the columns 304 form rows across the columns. In other words, as illustrated by FIG. 3, when a column 304a includes four lead frames 306, then the lead frame array 302 will have four rows of the lead frames 306. The number of such rows across the columns equals number of lead frames in a column. In various embodiments of the present invention, any suitable number of lead frames 306 may be included in a column 304 and any suitable number of columns 304 may be provided.

Each semiconductor die 308 is attached to a die pad (not shown) and bonded to leads 310 of one of the lead frames 306, for example, using wire-bonding, flip-chip or tape automated bonding processes. The leads 308 extend outside the lead frame 306 and serve as the means for external electrical connections between the semiconductor die 308 and external circuitry. According to the present invention, the lead frames 306 are arranged such that there is little or no spacing between the lead frames 306 in a column 304. Also, as can be seen, there is very little spacing between the columns 304 of the lead frame array 302.

In an embodiment of the present invention, each lead frame 306 includes at least one row of leads 310 that matches with the cavities of a mold chase, as will be explained in detail in conjunction with FIGS. 4A and 4B. In another embodiment of the invention, each lead frame 306 includes a pair of leads 310, with the leads 310 being disposed on opposing sides of the lead frame 306 along it's length.

In various embodiments of the present invention, the semiconductor dies 308 are of different sizes. The perimeters of the semiconductor dies 308 may vary from each other. The length (along the columns) of one semiconductor die 308 may be different from the length of another semiconductor die 308.

Figure 4A:
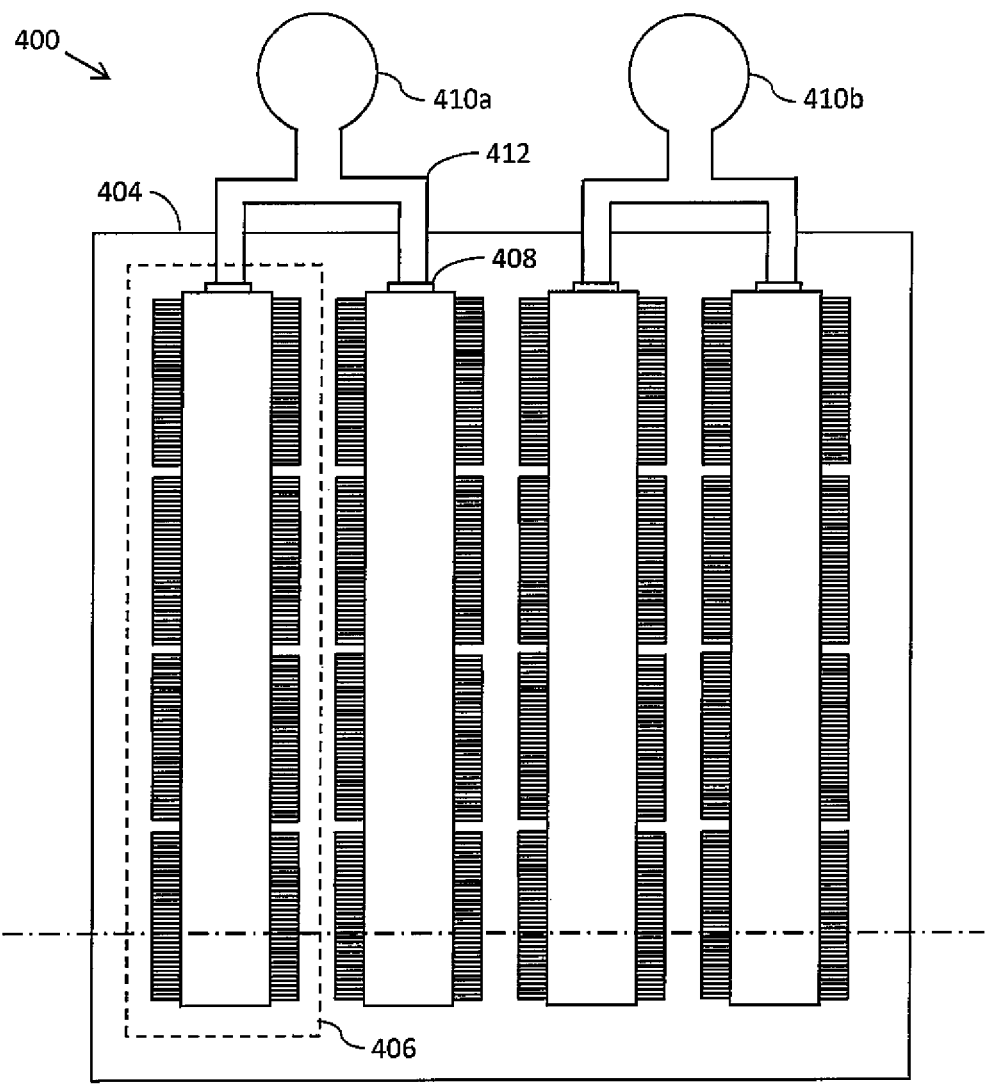
FIGS. 4A and 4B are a top view of a mold chase and a side cross-sectional view of a molding apparatus in accordance with an embodiment of the present invention.
Figure 4B:
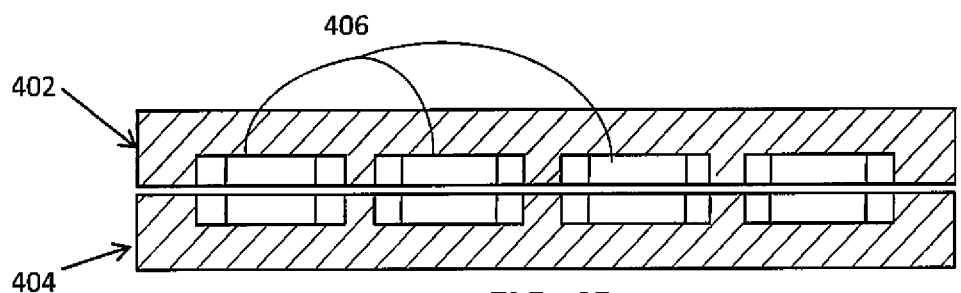

Referring now to FIGS. 4A and 4B, respective cross-sectional top and side views of a molding apparatus 400 in accordance with an embodiment of the present invention are shown. The molding apparatus 400 includes a top mold chase 402 (or upper mold chase) and a bottom mold chase 404 (or lower mold chase). A plurality of spaced cavities 406 is formed inside the upper and lower mold chases 402, 404. In an embodiment of the present invention, the upper and lower mold chases 402 and 404 have a substantially rectangular shape and the cavities 406 are formed along a length of the upper and lower mold chases 402 and 404. The cavities 406 are substantially parallel to and spaced from each other, i.e., they are placed at a predetermined distance from each other.

The upper and lower mold chases 402 and 404 are formed so that they can be aligned with each other by way of a clamp arrangement (not shown). The clamp may be mounted on an outer surface of the upper and lower mold chases 402 and 404. It should be noted that the clamp arrangement mentioned here is for illustrative purpose only. Any other suitable arrangement such as riveted joints, nut and bolt arrangement and the like may be used to secure the top and the bottom mold chases 402 and 404 together, without deviating from the scope and spirit of the present invention.

The lead frame array 300 is placed between the upper and lower mold chases 402 and 404, such that the columns 304 of lead frames 306 fit within separate ones of the spaced cavities 406. In an embodiment of the present invention, each lead frame 306 includes at least one row of leads 310 that is aligned with each edge of the corresponding cavity 406. In other words, for a lead frame 306 having two opposing rows of leads 310, the rows of leads are aligned with the edges of the corresponding cavity 406. In this manner, the lead frame array 300 is accommodated in the spaces created by the cavities 406 of the upper and the lower mold chases 402 and 404.

Figure 5:
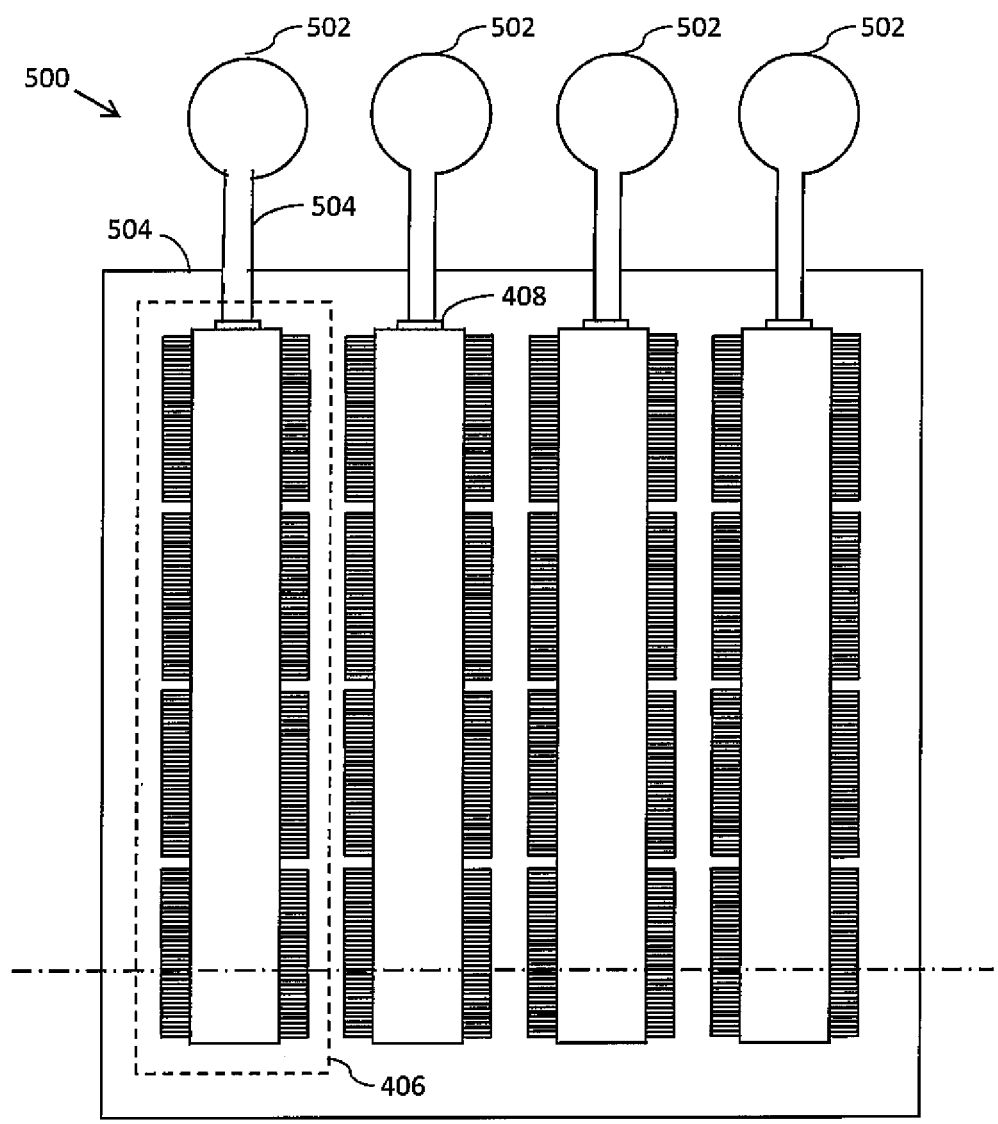
FIG. 5 is a top view of a mold chase in accordance with another embodiment of the present invention.

The molding apparatus 400 includes one or more gates 408 located at an opening at one end of a corresponding one of the cavities 406. That is, each cavity 406 has a just single gate located at one end thereof. In an embodiment of the present invention, the gates 408 are connected to molding compound injection units or pots 410a and 410b (collectively referred to as pots 410). In other embodiments, the molding apparatus may have more or fewer pots 410. For example, FIG. 5 shows an embodiment of a molding apparatus having four columns of cavities and one pot for each column. 406, one, two or four molding compound injection units 410 may be used.

Each pot or molding compound injection unit 410 is connected to one of the gates 408 with a passageway 412. The molding compound flows through the passageways 412 to the gates 408 and into the cavities 406, where the mold compound then flows through the cavities 406 and over the multiple lead frames within the cavity uninterrupted.

Figure 2:
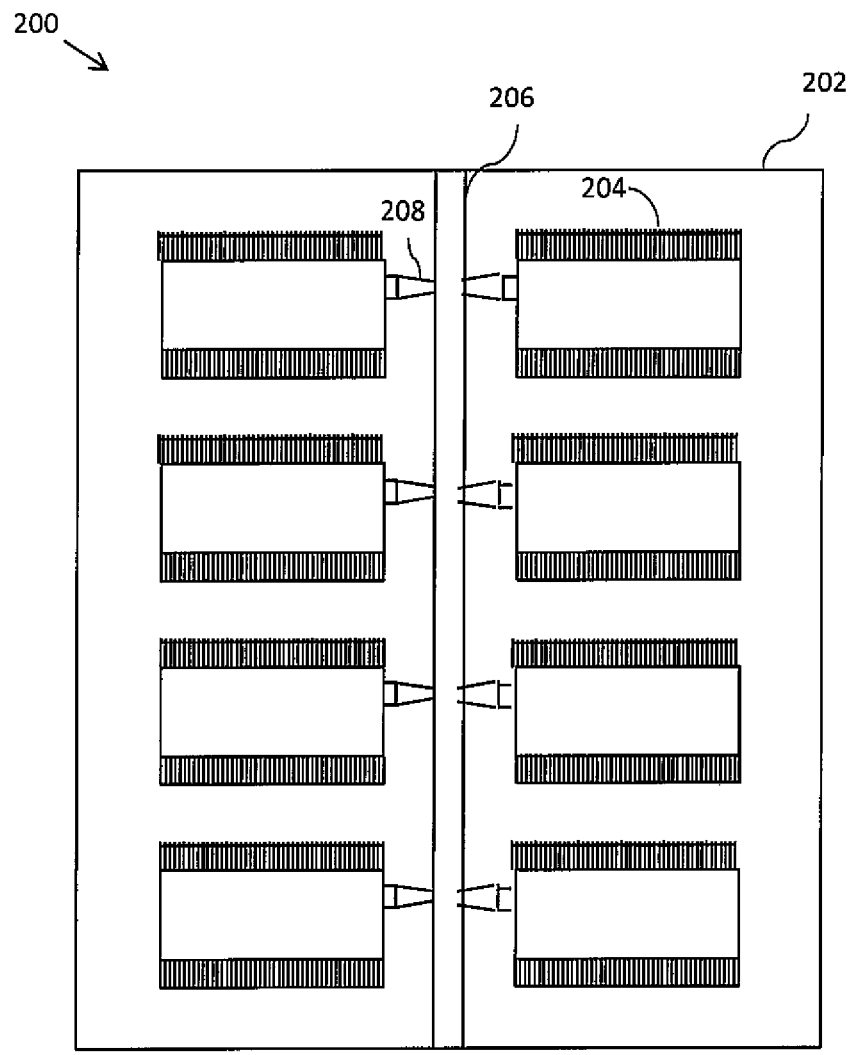
FIG. 2 is a top view of a mold chase of a conventional molding apparatus.

Each gate 408 is capable of receiving a molding compound from the molding compound injection unit 410. The molding compound injection unit 410 injects the molding compound into the cavities 406 via the passageways 412 and the gates 408. As there are no gates 408 within the cavities 406 and just a single gate 408 at the head or one end of a cavity 406, the mold compound is able to flow unimpeded along an entire column. This makes both for more efficient flow of mold compound (flow in one direction as opposed to changing direction 90° in the prior art) and more compact layout of lead frames within an array of lead frames. Thus, also the need for runners 206 (FIG. 2) is eliminated. Further, semiconductor dies of different sizes may be molded using a single molding apparatus 400.

The molding compound may be an epoxy resin, phenolic hardeners, silicas, mold release agents and the like. When the molding compound hardens or dries sufficiently, the upper and lower mold chases 402 and 404 are separated and the encapsulated semiconductor dies are removed from the cavities 406. A deflashing operation may be performed on the encapsulated semiconductor dies to remove excess mold compound. The encapsulated semiconductor dies may be further subjected to trim and form processes as are known to those of skill in the art. The encapsulated semiconductor dies also are separated from each other into individual packaged devices by performing a singulation operation using a saw or laser cutting device. The molding apparatus 400 may be used for forming a Dual In-Line Package (DIP), a Thin Shrink Small Outline Package (TSSOP), a Shrink Small Outline Package (SSOP), a Small Outline IC Package (SOIC), a Single-In-Line Package (SIP), a Small Outline J-Lead Package (SOJ), a Shrink Plastic Dual-in-Line Package (SPDIP), a Thin Small Outline Package (TSOP), a Very Small Outline Package (VSOP), and a Plastic Dual-in-Line Package (PDIP).

FIG. 5 is a cross-sectional top view of a molding apparatus 500 in accordance with another embodiment of the present invention. The molding apparatus 500 is similar to the molding apparatus 400 except that it has one pot 502 for each cavity 406, with each one of the pots 502 being connected to the cavities with individual passages 504. Each cavity 406 also has one gate 408 for monitoring mold compound flow into the cavity 406. As with the molding apparatus 400 of FIG. 4, in the molding apparatus 500, the mold compound is able to flow without interruption across multiple lead frames within a column/cavity 406.

Figure 6:
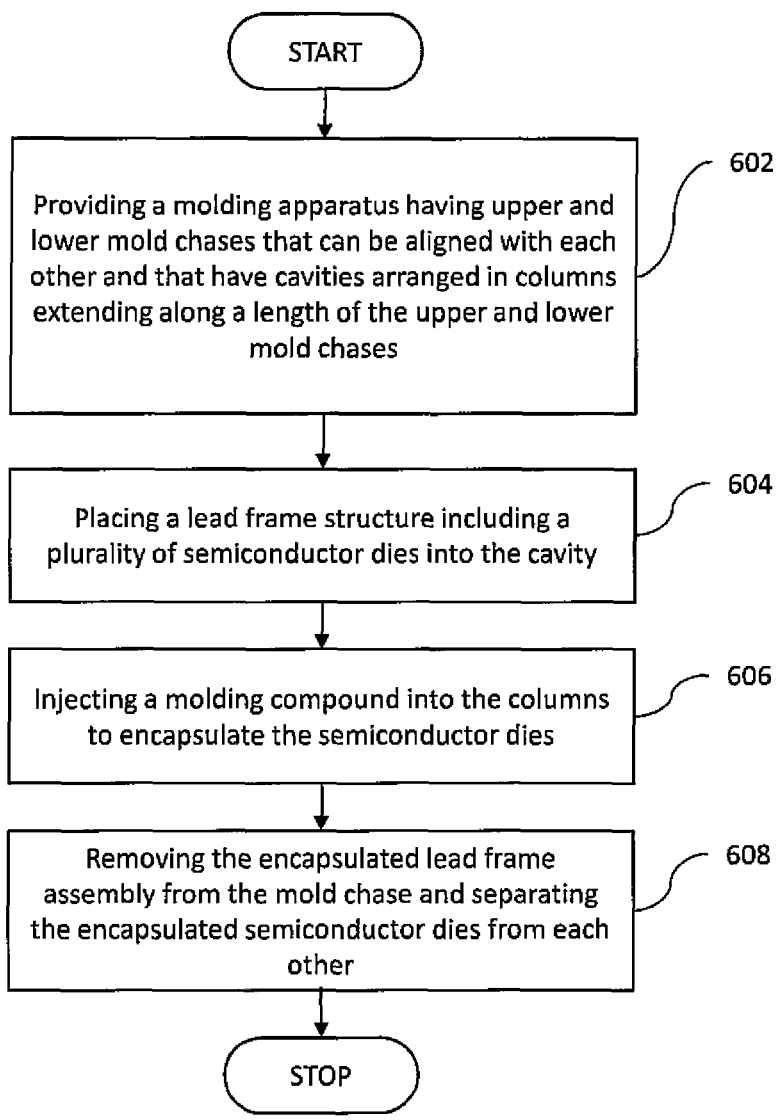
FIG. 6 is a flowchart illustrating a method for packaging a semiconductor device in accordance with an embodiment of the present invention.

Referring now to FIG. 6, a flowchart illustrating a method for packaging a semiconductor device in accordance with an embodiment of the present invention is shown. Various steps of the flowchart have been explained in conjunction with FIGS. 3, 4A-4B and 5. At step 602, a molding apparatus such as the molding apparatus 400 or 500 is provided. The molding apparatus includes upper and lower mold chases that are generally mirror images of each other, such as the upper and lower mold chases 402 and 404. Columns of cavities are formed by the mold chases for receiving a lead frame array that has columns of lead frames.

At step 604, a lead frame array is placed in the molding apparatus such that columns of lead frames fit within the cavities of the molding apparatus. Each of the cavities includes a gate to control the flow of mold compound from a pot into the cavity. The gates are connected to the pots or molding compound injection unit by way of passageways, such as the passageways 412.

At step 606, the molding compound is injected into the cavities. The molding compound may be preheated to an appropriate temperature (above the melting point of the molding compound) to facilitate flowing of the mold compound into the cavities. Alternatively, the mold compound may be poured into the cavities using a hydraulic-plunger arrangement. Other methods of moving the mold compound to the gates and into the cavities may also be used. After the cavities are filled with molding compound and the lead frame assemblies within the cavities are encapsulated, the molding compound is allowed to cool. As is known by those of skill in the art, the molding compound hardens as it cools.

At step 608, the upper and lower mold chases are separated and the now encapsulated lead frame array is removed therefrom so that individual devices may be formed by singulation.

In an embodiment of the invention, a deflashing operation is performed on the encapsulated semiconductor dies in which excess mold compound is removed from the leads. The deflashing operation may include dry blasting, wet blasting, chemical deflash, high pressure water deflash and combinations thereof. Additionally, trim and form operations may be performed, as are known in the art.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It should be understood that, although the terms first, second, etc. and horizontal and vertical are used to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What claimed is:

1. A method for encapsulating a semiconductor die with a molding compound, comprising:
   providing a molding apparatus that includes an upper mold chase configured for alignment with a lower mold chase, wherein the upper and lower mold chases each include a plurality of columns of cavities, each cavity for receiving a column of at least two lead frame assemblies of an array of lead frame assemblies such that each of the lead frame assemblies in a column forms rows across the plurality of columns, and wherein each lead frame assembly comprises a lead frame and a semiconductor die electrically connected to the lead frame;
   placing the array of lead frame assemblies into the plurality of cavities, wherein each lead frame includes at least one row of leads, and wherein the at least one row of leads is aligned along the length of the cavity; and
   injecting the molding compound into the each of the plurality of columns at one end of the columns such that the molding compound flows uninterrupted over each cavity and lead frame assembly in each row of each column, thereby encapsulating the lead frame assemblies.

2. The method of claim 1, further comprising removing the encapsulated lead frame assemblies from the upper and lower mold chases and performing a singulation operation to separate individual encapsulated lead frame assemblies from adjacent encapsulated lead frame assemblies, thereby forming individual semiconductor devices.

3. The method of claim 1, wherein the plurality of cavities are substantially parallel to each other, and wherein each column includes a gate formed at a top thereof for receiving the molding compound.

4. The method of claim 1, wherein the semiconductor die is attached to the lead frame by a wire bonding process.

5. The method of claim 1, wherein the semiconductor die is attached to the lead frame by a flip chip process.

6. The method of claim 1, wherein the lead frame array comprises one of a Single In-Line Package (SIP) and a Dual In-Line Package (DIP) lead frame.

* * * * *